United States Patent [19]

Ito et al.

[11] Patent Number: 4,481,546
[45] Date of Patent: Nov. 6, 1984

[54] MODULATOR-DEMODULATOR FOR OBTAINING AND DEMODULATING FREQUENCY-MODULATED SIGNAL

[75] Inventors: Shigeyuki Ito, Yokohama; Yoshizumi Watatani, Fujisawa; Hitoaki Owashi, Tokyo, all of Japan

[73] Assignee: Hitachi, Ltd., Tokyo, Japan

[21] Appl. No.: 434,881

[22] Filed: Oct. 18, 1982

[30] Foreign Application Priority Data

Oct. 19, 1981 [JP] Japan ............... 56-165803
Jun. 30, 1982 [JP] Japan ............... 57-111709

[51] Int. Cl.³ ........................................ G11B 5/04
[52] U.S. Cl. ................................ 360/30; 332/16 R
[58] Field of Search .............. 360/30; 332/16 R, 23 R

[56] References Cited

U.S. PATENT DOCUMENTS 4,165,518 8/1979 Hirai .................... 360/30

Primary Examiner—Vincent P. Canney
Attorney, Agent, or Firm—Antonelli, Terry & Wands

[57] ABSTRACT

A modulator-demodulator suited to record an audio signal in a recording medium in the form of a frequency-modulated signal and to demodulate the frequency-modulated signal is disclosed. It includes a voltage-controlled oscillator, a switching circuit for changing one of two input frequency-modulated signals toward a control input of the voltage-controlled oscillator, and a phase detector for detecting a difference in phase between the frequency-modulated signal reproduced from the recording medium and the output signal of the voltage-controlled oscillator. In a recording operation, an input audio signal is supplied to a control signal input terminal of the voltage-controlled oscillator through the switching circuit, and the VCO acts as a modulator for carrying out frequency modulation. In a reproducing operation, the output signal of the phase detector is supplied to the control signal input terminal of the VCO through the switching circuit to form a demodulator having a phase locked loop configuration, and the frequency-modulated signal reproduced from the recording medium is demodulated by the demodulator. A single VCO is used as the VCO for forming the modulator in the recording operation, and is used as the VCO for forming the demodulator having the phase locked loop configuration in the reproducing operation.

8 Claims, 4 Drawing Figures

MODULATOR-DEMODULATOR FOR OBTAINING AND DEMODULATING FREQUENCY-MODULATED SIGNAL

The present invention relates to a modulator-demodulator for obtaining and demodulating a frequency-modulated signal, and more particularly to a modulator-demodulator suitable for use in a system for recording an audio signal in the form of a frequency-modulated signal and reproducing the recorded signal.

There have been known various methods for recording a signal and reproducing the recorded signal, in one of which a signal to be recorded is converted into a frequency-modulated signal and then recorded. As a typical device for carrying out this method, a device has been known which records and reproduces a video signal by using a magnetic tape as a recording medium (hereinafter referred to as a "video tape recorder"). At present, a large number of home video tape recorders are put on the market. In all of these video tape recorders, the video signal is processed in the form of a frequency-modulated signal, and an audio signal is recorded on a track different from a track for the video signal, by a fixed hand through the so-called a.c. bias method.

The recording density in magnetic tapes used in recent video tape recorders has been improved remarkably. In some cases, the recording density is about 17 times larger than that of about ten years ago. Further, it is earnestly required to make a home video tape recorder small in size, and a technique for developing a small-sized video tape recorder has made advance. From these facts, it is required to make the running speed of magnetic tape as slow as possible and to make the width of recording track as small as possible.

As a result, according to the method of recording an audio signal by the fixed head through the a.c. bias method, the frequency band of a reproduced signal is narrow, the signal-to-noise ratio of the reproduced signal is low, the wow and flutter characteristic is deteriorated, and therefore it is difficult to obtain a reproduced audio signal of very satisfactory sound quality.

In order to prevent the sound quality of a reproduced audio signal from being deteriorated, a method has been proposed in which an audio signal is converted into a frequency-modulated signal, then the frequency-modulated signal thus obtained is mixed with another frequency-modulated signal into which a video signal is converted, and the mixed signal is recorded by a rotating head. In the above method using the rotating head, the relative speed of a recording/reproducing head and a magnetic tape is much larger than the running speed of the magnetic tape. Accordingly, this method has the following advantages.

(1) Recording and reproducing operations are affected only a little by variations in the running speed of magnetic tape, and therefore the wow and flutter characteristic is excellent.

(2) The frequency band of a reproduced signal is independent of the running speed of magnetic tape, and therefore it is possible to widen the frequency band of the reproduced signal.

In the case where a signal frequency-modulated with an audio signal is mixed with a signal frequency-modulated with a video signal in order to record and reproduce these frequency-modulated signals, a modulator-demodulator for processing the audio signal is required in addition to a modulator-demodulator for processing the video signal. A multivibrator or a voltage-controlled oscillator using a voltage-dependent capacitor is used as a modulator for frequency-modulating a carrier with an audio signal (hereinafter referred to as an "FM modulator"). Further, a quadrature demodulation circuit, PLL (namely, phase locked loop) demodulation circuit, or pulse counting detection circuit is used as a demodulator for demodulating a reproduced, frequency-modulated signal (hereinafter referred to as an "FM demodulator").

When an FM modulator and an FM demodulator are provided to process audio signals in addition to a processing circuit for video signals, there arises a problem that a signal processing circuit becomes large in scale. Specifically, in the case where a great portion of an audio signal processing circuit is formed of an integrated circuit, a number of terminals for connecting external parts to the FM modulator and FM demodulator are required. For example, in the case where an emitter-coupled astable multivibrator is used as the FM modulator, at least two terminals for connecting a capacitor and a resistor, which determine an oscillation frequency, are required, and also a terminal for connecting a resistor, which is a circuit element of a constant current source, is required to the multivibrator. Further, in the case where a quadrature detection circuit is used as the FM demodulator, a coil is required to form a phase shifter, and at least three terminals for connecting the coil to the demodulation circuit are required. Alternatively, in the case where a PLL demodulation circuit is used as the FM demodulator, an oscillator in the PLL demodulation circuit requires at least three terminals for connecting external circuit elements including a capacitor to the oscillator, as in the above-mentioned FM modulator.

Since the capacitor, coil and others cannot be formed in an integrated circuit, six terminals are required for both of the FM modulator and FM demodulator. Accordingly, when that portion of an audio signal processing circuit which includes the FM modulator, FM demodulator and others, is formed of an integrated circuit, the fabrication of the integrated circuit is affected by the above-mentioned terminals.

Further, since the FM modulator and FM demodulator are independent of each other, the modulation sensitivity is usually different from the demodulation sensitivity. Accordingly, a monitor output for monitoring an input signal in a recording operation is different in level from the output of reproduced signal in a reproducing operation, and level adjusting means for making these outputs equal in level to each other is required.

An object of the present invention is to provide an FM modulator-demodulator which has a small number of terminals to be connected with external circuit elements, is suitable for use in an integrated circuit, and is suited to record and reproduce an audio signal.

In a modulator-demodulator used in a recording/reproducing device, the demodulator is not required to operate when the modulator is operated, and the modulator is not required to operate when the demodulator is operated. In view of the above fact, the present invention has a characteristic feature that a modulator and a demodulator use a circuit part in common. That is, a modulator-demodulator according to the present invention comprises a single voltage-controlled oscillator, signal switching means, a phase detector, and a loop filter. When the modulator-demodulator is operated as a modulator in a recording operation, an input signal is applied to the control input terminal of the voltage-controlled oscillator through the signal switching means, and a frequency-modulated signal is given by the oscillation output of the voltage-controlled oscillator. When the modulator-demodulator is operated as a demodulator in a reproducing operation, the signal switching means is set so that the output of the phase detector is applied to the control input terminal of the voltage-controlled oscillator through the loop filter, a reproduced signal and the output of the voltage-controlled oscillator are supplied to the phase detector to detect a phase difference therebetween, and thus a PLL demodulation circuit is formed in which the output of the phase detector is taken out as a demodulated output. Further, automatic frequency control means may be added to the voltage-controlled oscillator, to stablize the center frequency of the oscillator. In this case, the frequency drift due to variations in ambient temperature can be prevented, and a variation in the center frequency due to variations in circuit parts can be eliminated. In a video tape recorder, for example, a head switching pulse based upon the rotation of a rotating head and having a frequency of 30 Hz or a control signal having a constant frequency is used as a reference signal for automatic frequency control.

According to the characteristic feature of the present invention, a single voltage-controlled oscillator is used in both of the modulator and demodulator. Therefore, a signal processing circuit can be made simple in structure. Specifically, in the case where the modulator, demodulator and others are formed of an integrated circuit, not a plurality of oscillators but a single oscillator is connected to external circuit elements through terminals. Therefore, the number of terminals to be connected with the external circuit elements becomes small, and the integrated circuit can be designed with ease. Further, the same voltage-controlled oscillator is used in the recording and reproducing operations, and an input signal in the recording operation and the output of the phase detector in the reproducing operation are applied to the same control input terminal of the voltage-controlled oscillator. Accordingly, the input signal and the output of the phase detector are equal in level to each other, and therefore it is necessary to make level adjustment between a monitor signal for monitoring the input signal and a reproduced output signal. Further, even when a non-linear relation exists between an input signal and a frequency-modulated signal, the effect of the non-linear relation upon the frequency-modulated signal and the effect of the non-linear relation upon a demodulated signal cancel each other, since the same voltage-controlled oscillator is used in the recording and reproducing operations. Accordingly, the distortion of the demodulated signal is improved in a marked degree as compared with that in the case where a modulator and a demodulator are provided independently of each other.

The present invention will be apparent from the following detailed description taken in conjunction with the accompanying drawings, in which.

Figure 1:
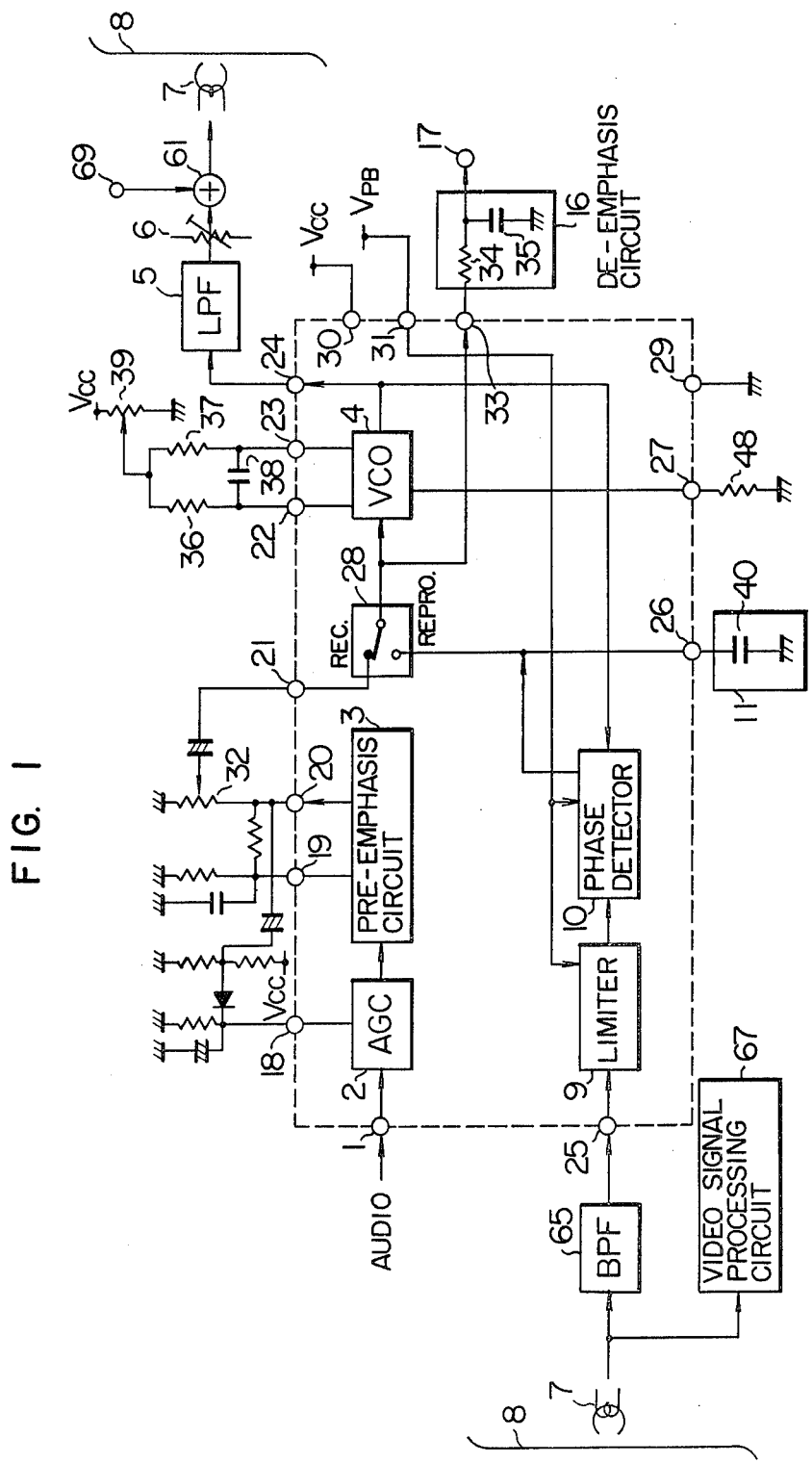
FIG. 1 is a block diagram showing an embodiment of the present invention which is formed of an integrated circuit.

FIG. 1 shows an embodiment of a modulator-demodulator for obtaining and demodulating a frequency-modulated signal according to the present invention. The present embodiment is used in a recording/reproducing device in which an audio signal is converted into a frequency-modulated signal, and then combined with a video signal in accordance with a frequency division multiplex system, to be recorded and reproduced.

In FIG. 1 a circuit part bounded by broken lines can be formed of an integrated circuit.

In a recording period, an audio signal inputted to an input terminal 1 is applied to a terminal 20 through an automatic gain control circuit (namely, an AGC circuit) 2 and a pre-emphasis circuit 3, and supplied from the terminal 20 to a variable resistor 32. At the variable resistor 32, the audio signal is subjected to level adjustment for correcting deviations. The audio signal thus adjusted is applied to a terminal 21. Terminals 19 and 20 are connected to a capacitor and resistors as illustrated, to determine the emphasis characteristic of the pre-emphasis circuit 3. Further, a terminal 18 is applied with a signal which is obtained by subjecting a pre-emphasized signal to diode detection and is used to control the AGC circuit 2. The level-adjusted signal applied to the terminal 21 is supplied through a switching circuit 28 to a VCO (namely, voltage-controlled oscillator) 4 formed of, for example, an emitter-coupled multivibrator, which generates a carrier signal having been frequency-modulated with the input audio signal. The frequency-modulated signal is outputted from a terminal 24, and applied to a low pass filter 5 in which unnecessary frequency components are removed from the frequency-modulated signal. The amplitude of the frequency-modulated signal having passed through the low pass filter 5 is adjusted by a level adjuster 6 for adjusting the recording level. Then, the signal frequency-modulated with the audio signal (hereinafter referred to as "audio FM signal") is mixed by an adder 61 with a video signal applied from a terminal 69, and the signal thus obtained is supplied to a magnetic head 7 to be recorded in a magnetic tape 8. The video signal applied to the terminal 69 has been processed by a well-known processing circuit (not shown) so that a signal suitable for recording is formed. For example, a luminance signal component is converted into a frequency-modulated signal having a frequency band located above 1 MHz or more, and a chrominance signal component is converted into a carrier chrominance signal whose carrier frequency is located less than 1 MHz. Resistors 36 and 37, a capacitor 38 and a variable resistor 39 are connected to terminals 22 and 23 as illustrated, to adjust the oscillation frequency of the VCO 4. This oscillation frequency is selected, for example, between the frequency band of the carrier chrominance signal placed in a low frequency range and the frequency band of the frequency-modulated luminance signal, or within a frequency range lower than the frequency band of the carrier chrominance signal. A terminal 27 is connected to a resistor 48 used for a current source of the emitter-coupled multivibrator of the VCO 4. Further, a monitor signal for monitoring the input signal in the recording operation is given by a signal outputted from a terminal 17. In more detail, the output signal of the switching circuit 28, namely, the input signal of the VCO 4 passes through a de-emphasis circuit 16, which is connected to a terminal 33 and made up of a resistor 34 and a capacitor 35, and then applied to the terminal 17 to provide the monitor signal.

In a reproducing operation, a signal reproduced from the magnetic tape 8 by the magnetic head 7 is applied to a band pass filter 65 to extract the audio FM signal from the reproduced signal, and the audio FM signal is applied to a limiter 9 through a terminal 25. Further, part of the reproduced signal is supplied to a signal processing circuit 67 for processing video signals. In the signal processing circuit 67, the frequency-modulated signal corresponding to the luminance signal and the carrier chrominance signal are extracted from the reproduced signal, and various processing, for example, demodulation and frequency conversion are performed for the extracted signals to reproduce an ordinary television signal. The audio FM signal having passed through the limiter 9 is applied to one input terminal of a phase detector 10. The other input terminal of the phase detector 10 is applied with the output of the VCO 4. The output of the phase detector 10 is applied to the control input terminal of the VCO 4 through the switching circuit 28 which is now set to the reproduction side. Further, a capacitor 40 is connected to the output side of the phase detector 10 through a terminal 26, to form a loop filter together with a resistor (not shown) provided at the output stage of the phase detector 10. That is, the VCO 4 acting as a modulator in the recording operation is operated as a voltage-controlled oscillator of a PLL demodulation circuit in the reproducing operation. An error signal corresponding to a difference in phase between the output signal of the VCO 4 controlled by an average frequency of the reproduced audio FM signal and the instantaneous frequency of the reproduced audio FM signal is outputted from the phase detector 10 as a demodulated audio signal, which is applied to the de-emphasis circuit 16 through the switching circuit 28 and terminal 33. After the frequency characteristic of the demodulated audio signal has been equalized by the de-emphasis circuit 16, the demodulated audio signal is outputted from the terminal 17 as a reproduced audio signal. The de-emphasis circuit 16 may be formed of, for example, a CR low-pass filter including a resistor 34 and a capacitor 35.

Since the VCO 4 acting as a modulator in the recording operation is operated as the voltage-controlled oscillator of the PLL demodulation circuit in the reproducing operation, the VCO 4 must be controlled so that the frequency deviation of the frequency-modulated signal outputted from the VCO 4 in the recording operation is equal to the frequency deviation given by the VCO 4 in the reproducing operation. In other words, the input signal voltage applied to the VCO 4 in the recording operation becomes equal to the input signal voltage applied to the VCO 4 in the reproducing operation, and therefore level adjustment between the monitor signal in the recording operation and the reproduced audio signal is not required. Further, the voltage-frequency conversion characteristic of the VCO 4 in the recording operation is cancelled by that in the reproducing operation and therefore the distortion factor of the reproduced audio signal is improved.

Figure 2:
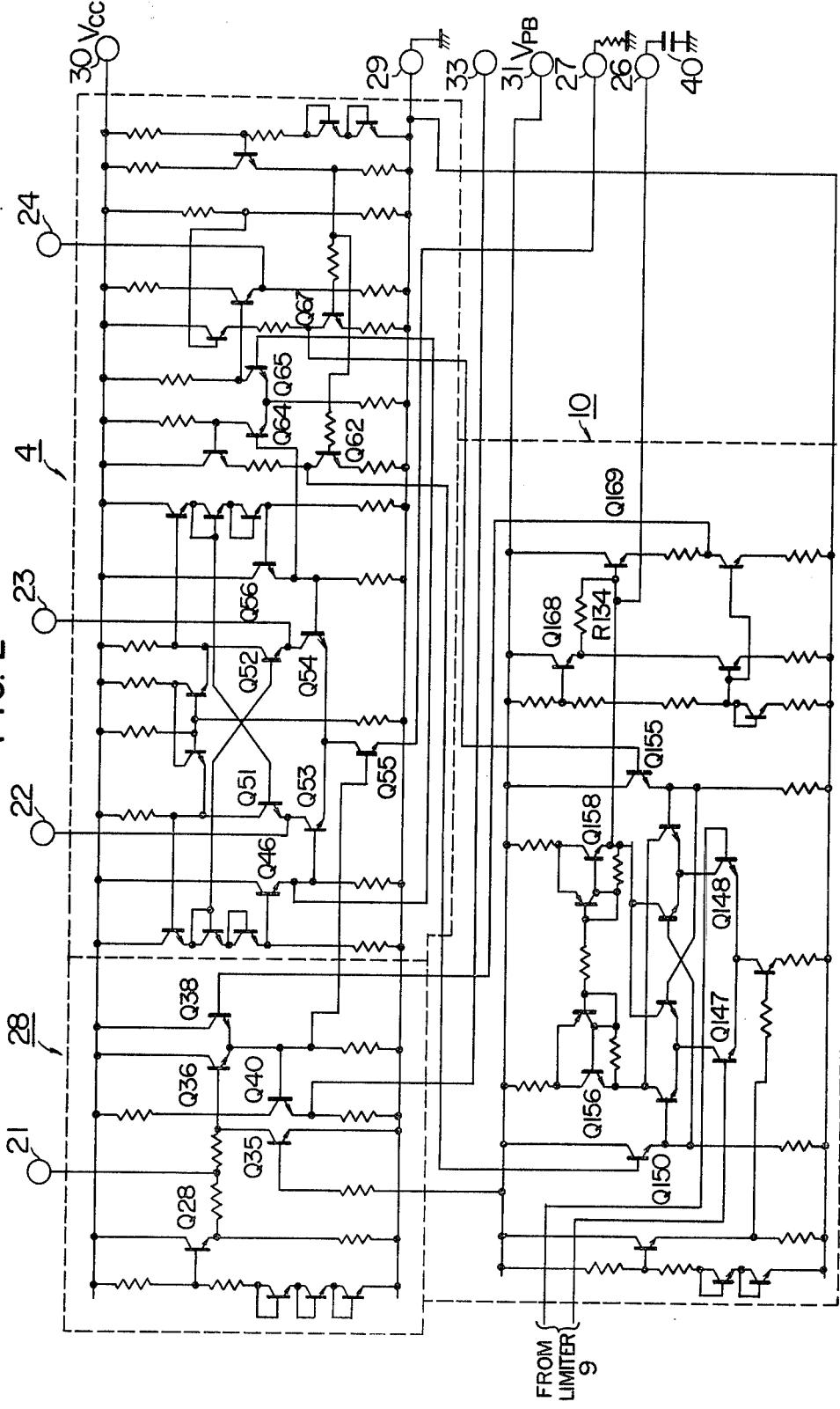
FIG. 2 is a detailed circuit diagram showing an example of a main circuit part of the embodiment shown in FIG. 1.

In the embodiment shown in FIG. 1, the AGC circuit 2, pre-emphasis circuit 3 and VCO 4 are always operated from a power supply $V_{cc}$ connected to a terminal 30, and the limiter 9 and phase detector 10 are operated only for the reproducing period from a power supply $V_{PB}$ which is connected to a terminal 31 and is generated only for the reproducing period. Accordingly, the set positions of the switching circuit 28 corresponding to recording and reproducing operations can be changed over by using the above-mentioned power supplies. FIG. 2 shows a circuit configuration which includes the switching circuit 28 for performing such a switching operation, VCO 4 and phase detector 10, and is suitable for use in an integrated circuit. Each of the AGC circuit 2, pre-emphasis circuit 3, limiter 9 and others shown in FIG. 1 can be formed of a well-known circuit. When these circuits 2, 3 and 9 are included in the integrated circuit, it is desirable to use a differential amplifier as a fundamental circuit element.

In FIGS. 1 and 2, like terminals to be connected with external circuit elements are given like reference numerals.

Referring to FIG. 2, the switching circuit 28 includes transistors Q36, Q38 and Q35 as its main components. The base of the transistor Q36 is applied with a bias potential from bias means including a transistor Q28, and an input audio signal from the terminal 21. The emitters of the transistors Q36 and Q38 are connected with each other, and the base of the transistor Q38 is supplied with the output of the phase detector 10. The collector and emitter of the transistor Q35 are connected to the base of the transistor Q36 and ground, respectively, and the transistor Q35 is turned on only for a reproducing period. The bias means is set so that the transistor Q36 is turned on for the recording period. In the recording period, the transitor Q36 acts as an emitter follower, and the input audio signal supplied from the terminal 21 is sent from the emitter of the transistor Q36 to the base of a transistor Q55. The transistor Q55 is used for forming the current source of the VCO 4. Accordingly, the oscillation frequency of the VCO 4 is controlled by the input audio signal, and thus frequency modulation is carried out. Further, the emitter output of the transistor Q36 is supplied to the terminal 33 through a transistor Q40 for shifting a d.c. level, to be used as a monitor signal in the recording period. In a reproducing period, the supply voltage $V_{PB}$ which is generated only for the reproducing period, is supplied from the terminal 31 to the base of the transistor Q35, and thus the transistor Q35 is turned on. Accordingly, a signal from the terminal 21 is interrupted by the transistor Q35, and the bias voltage applied to the base of the transistor Q36. is reduced. Thus, the transistor Q36 is turned off. Simultaneously with the above operations, the base of the transistor Q38 is applied with the supply voltage from the terminal 31 through a transistor Q169, and the transistor Q38 becomes operable. The transistor Q38 is supplied with an output signal (including a d.c. bias component) from the emitter of a transistor Q169 provided at the output stage of the phase detector 10, and thus turned on. As a result, the output signal of phase detector 10 is supplied to the transistor Q55 in the VCO 4 and the terminal 33. The phase detector 10 is supplied with an oscillation output from respective collectors of transistors 62 and 67 which are part of transistors for forming the output stage of the VCO 4, and is further supplied with a reproduced audio FM signal from the limiter 9. The oscillation output is applied to transistors Q150 and Q155 in the phase detector 10, and the reproduced audio FM signal is applied to transistors Q147 and Q148. That is, each of the oscillation output and reproduced audio FM signal is applied to a differential circuit through two signal paths. An error signal is outputted from the phase detector 10 as the result of the phase comparison of the oscillation output with the reproduced audio FM signal. It is a signal corresponding to a difference between the oscillation frequency of the VCO 4 and the instantaneous frequency of the reproduced audio FM signal. Accordingly, the error signal is the demodulated audio signal if the oscillation frequency of the VCO 4 responds to the average output of the phase detector. A resistor R134 which is connected between the emitter of a transistor Q168 and the base of the transistor Q169 provided at the output stage of the phase detector 10, and an external capacitor 40 connected to a terminal 26 make up a loop filter.

As mentioned above, the VCO 4 can be used as the FM modulator in the recording period or the oscillator of the PLL demodulation circuit in the reproducing period, on the basis of the switching operation of the switching circuit 28. Accordingly, those terminals to be connected with external circuit elements can be omitted which are additionally required in the case where another voltage-controlled oscillator is provided in the demodulation circuit, or an FM modulator and an FM demodulator are provided independently of each other.

Figure 3:
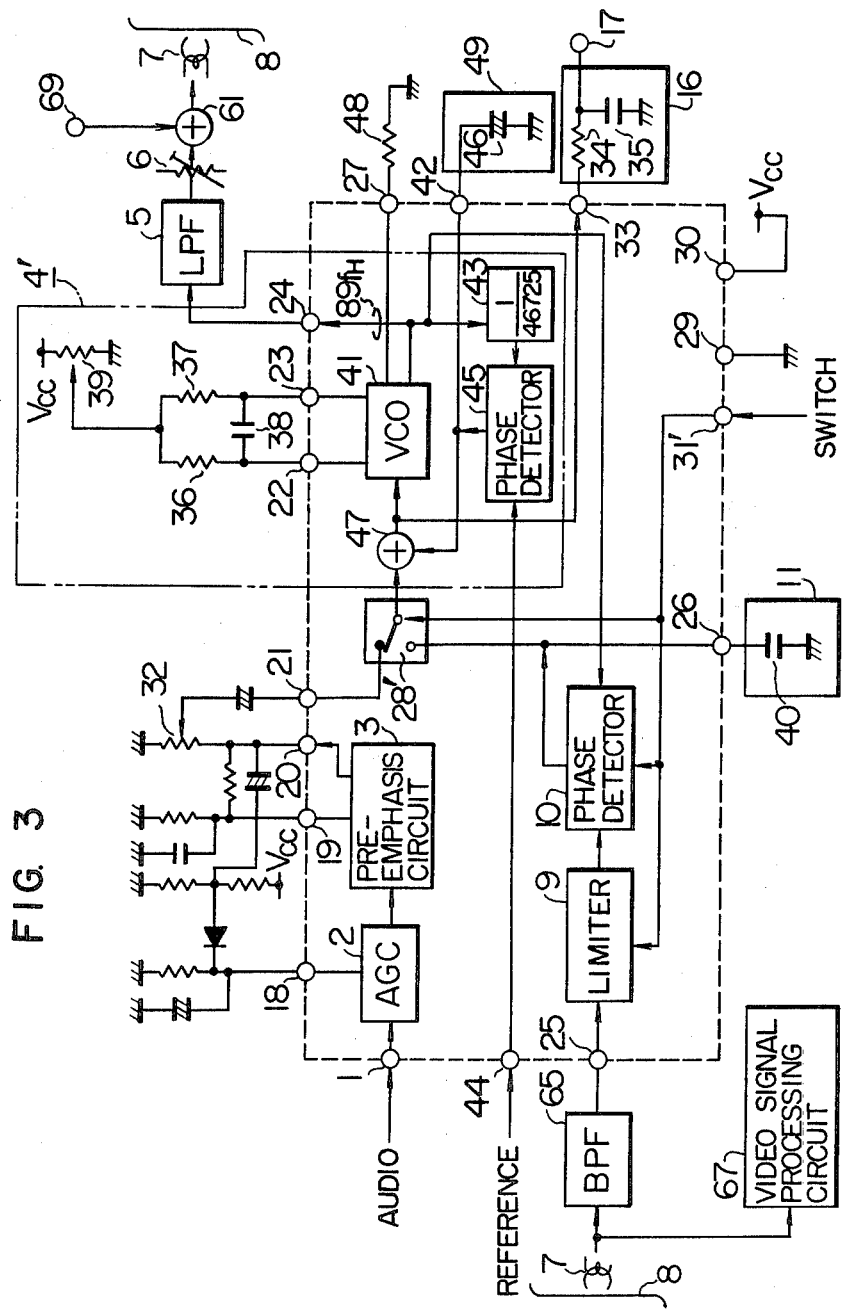
FIG. 3 is a block diagram showing another embodiment of the present invention in which an automatic frequency control device is added to the embodiment shown in FIG. 1.

Next, another embodiment of the present invention will be explained with reference to FIG. 3. In FIG. 3, circuits having the same functions as circuits shown in FIG. 1 are designated by the same reference numerals as in FIG. 1, and a circuit part bounded by broken lines can be formed of an integrated circuit as in FIG. 1. A main difference between the embodiments shown in FIGS. 1 and 3 resides in that automatic frequency control (AFC) for stabilizing the center value of the oscillation frequency of a VCO 4' is performed in the embodiment shown in FIG. 3. In a recording period, an input audio signal having been pre-emphasized and level-adjusted is applied from the terminal 21 to the VCO 4' through a switching circuit 28'. A circuit part bounded by dot-dash lines indicates the VCO 4'. The VCO 4' includes a voltage-controlled oscillator 41 which is formed of, for example, an emitter-coupled multivibrator and is a fundamental element of the VCO 4', a frequency divider 43 for dividing the oscillation frequency of the oscillator 41, a phase detector 45 for AFC, a loop filter 49, and an adder 47 for adding the output signal of the switching circuit 28' acting as the control signal of the VCO 4' and the output signal of the phase detector 45. Thus, the input signal having passed through the switching circuit 28' is added to the output signal of the phase detector 45 by the adder 47, and the output of the adder 47 is applied to the oscillator 41 as the control signal thereof. As a result, the oscillation frequency of the VCO 4' is controlled by the input audio signal, that is, frequency modulation is performed. The audio FM signal thus obtained is sent to the magnetic head 7 through the terminal 24, to be recorded in the magnetic tape 8 together with a video FM signal as in the embodiment shown in FIG. 1.

Now, the AFC operation will be explained. Let us consider the case where the center frequency of the oscillator 41 is 89 $f_H$ (where $f_H$ indicates the repetition frequency of horizontal synchronizing signal and is equal to, for example, 15.75 KHz) and a reference signal supplied from a signal source (not shown) through a terminal 44 has a frequency of 30 Hz. In this case, a ratio of the output frequency of the frequency divider 43 to the input frequency thereof is set to 1/46725. The phase of the signal obtained by frequency-dividing the output of the oscillator 41 is compared with the phase of the reference signal from the terminal 44 by the phase detector 45. The output signal of the phase detector 45, that is, an error signal is used as a control signal for AFC. The ripple component of the error signal is removed by the loop filter 49 which is connected to the phase detector 45 through a terminal 42. The error signal which does not contain the above ripple component, controls the oscillator 41 through the adder 47. As mentioned above, the VCO 4' has a PLL configuration, and the center frequency of the VCO 4' is automatically controlled by the reference signal applied to the terminal 44. The loop filter 49 can be formed by connecting only the capacitor 46 to the terminal 42, when a resistor provided at the output stage of the phase detector 45 is used as a component of the loop filter 49.

Since the oscillator 41 is also operated as an FM modulator, the oscillation frequency of the oscillator 41 has to vary in accordance with the input audio signal. In order to prevent the AFC operation from being affected by variations in the oscillation frequency of the oscillator 41, a signal subjected to phase detection is required to have a frequency lower than the frequency band of the input audio signal. Accordingly, the reference signal applied to the terminal 44 is required to be a low-frequency signal such as a 30 Hz rectangular wave signal in the present embodiment. In addition to this, a ripple component is removed from the output signal of the phase detector 45 by the loop filter 45. Accordingly, the oscillation frequency control signal applied to the adder 47, that is, the output of the AFC circuit substantially contains only a d.c. component.

In a video tape recorder, the rotational position of a rotating head is detected to control the rotational phase thereof, and a position detection signal thus obtained usually has a frequency of 30 Hz or an integral multiple thereof. Accordingly, this position detection signal is conveniently used as the reference signal in the video tape recorder. Specifically, in a home video tape recorder, the two-head system is generally used and a head switching signal formed on the basis of the position detecting signal is a 30 Hz rectangular wave signal. Accordingly, the head switching signal can be used as the reference signal. Further, a signal obtained by frequency-dividing a signal having a stable frequency such as the horizontal synchronizing signal or chrominance subcarrier signal contained in a video signal, can be used as the reference signal.

Thus, an audio FM signal is formed using a stable carrier frequency. The recording operation for the audio FM signal is similar to that in the embodiment shown in FIG. 1.

In a reproducing operation, a video/audio FM signal reproduced from the magnetic tape 8 by the magnetic head 7 is applied to a band path filter 65 in which only the audio FM signal is extracted. The audio FM signal is applied to the terminal 25, and the audio FM signal from the terminal 25 is applied to one input terminal of the phase detector 10 through the limiter 9. The limiter 9 and phase detector 10 are operated only for the reproducing period by applying a supply voltage to a terminal 31' only for the reproducing period. Alternatively, the terminal 31' is applied with a recording/reproduction switching signal having different logical levels between the recording period and reproducing period, and, for example, a bias circuit alway supplied with a supply voltage is turned on or off by the above switching signal to operate the limiter 9 and phase detector 10 only for the reproducing period. The other input terminal of the phase detector 10 is applied with the output of the VCO 4'. Accordingly, the phase detector 10 delivers a detection output corresponding to a difference between the instantaneous frequency of the reproduced audio FM signal and the output frequency of the VCO 4'. The detection output is applied to the loop filter including the capacitor 40 connected to the terminal 26, and is further applied to the VCO 4' through the switching circuit 28' which is now set to the reproduction side. As mentioned above, a PLL demodulation circuit is formed in the reproducing period, and a demodulated audio signal is sent from the output side of the adder 47 to the terminal 17 through the terminal 33 and de-emphasis circuit 16. The demodulated audio signal and the monitor signal in the recording operation may be sent from the input side of the adder 47, that is, the output side of the switching circuit 28' to the de-emphasis circuit 16.

The switching circuit 28' for changing the input of the VCO 4' from the signal corresponding to one of the recording and reproducing operations to the signal corresponding to the other operation, may be the same circuit as the switching circuit 28 shown in FIG. 2, when there is circuit means for applying a supply voltage to the limiter 9 and phase detector 10 only for the reproducing period. Alternatively, in the case where a recording/reproduction switching signal having different logical levels between the recording period and reproducing period, for example, having low- and high-levels in the recording and reproducing periods, respectively, is applied to the terminal 31' as shown in FIG. 3, one of the audio signal from the input terminal 1 and the output signal of the phase detector 10 can be selectively applied to the VCO 4' by using an analog gate which is controlled by the above switching signal.

Figure 4:
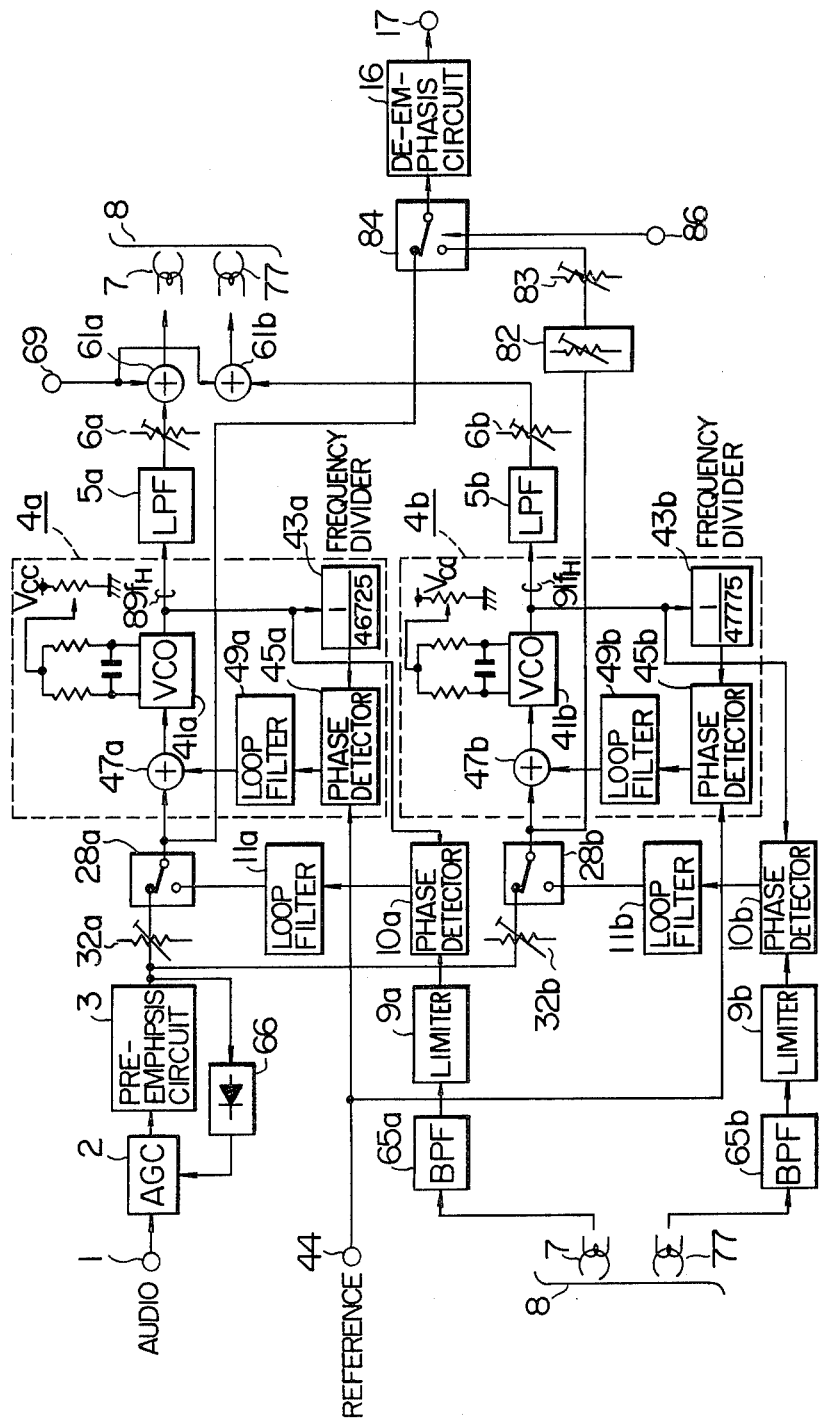
FIG. 4 is a block diagram showing a further embodiment of the present invention in which two carriers are used for an audio signal to suppress crosstalk from adjacent tracks.

Next, a further embodiment of the present invention will be explained. In most of home video tape recorders, in order to maintain a tracking margin or to improve the picture quality of a slow-motion or still picture image which is obtained by making the running speed of magnetic tape in a reproducing operation different from that in a recording operation, the gap width H of a magnetic head is set so that a relation $T \leq H \leq 2T$ is satisfied (where T indicates the width of a video track). Accordingly, a reproduced signal is subjected to disturbance due to crosstalk from an adjacent track. In order to solve this problem, a method has been generally used in which two magnetic heads are made different from each other in the azimuth of the gap of magnetic head to the direction of a recording track, to attenuate a signal on an adjacent track due to azimuth loss. This method is effective for a video signal which is recorded in the form of a signal having a relatively high frequency. However, in the case where a video FM signal in a high frequency band and an audio FM signal in a low-frequency band are mixed to be recorded in a magnetic tape, the audio signal is greatly disturbed by crosstalk since the azimuth loss is small in the low frequency band. Crosstalk noise due to crosstalk is generated with regard to or in proportion to a difference in frequency between a crosstalk signal and a desired signal. That is, the crosstalk noise is heard together with a reproduced audio signal, and is offensive to the ear. In order to prevent the disturbance due to crosstalk, a method can be used in which video tracks are made different from each other in carrier frequency of the frequency-modulated signal recorded thereon. FIG. 4 shows a further embodiment of the present invention which uses the above-mentioned method. In the present embodiment, two modulators are provided for frequency-modulating two carriers, which are different from each other in center frequency, with a single audio signal, and respective frequency-modulated outputs of the modulators are alternately recorded on a magnetic tape by two rotating head of helical scanning type, after having been mixed with a video signal. Further, two signals alternately reproduced by the rotating heads are alternately demodulated by two demodulators, and respective outputs of the demodulators are combined with each other to obtain a continuous audio signal. The present embodiment is fundamentally identical to the embodiment shown in FIG. 3, except that two modulators and two demodulators are used. Incidentally, through the video signal processing circuit 67 is omitted in FIG. 4, it is needless to say that a video FM signal is reproduced and demodulated. Now, the operation of the present embodiment will be explaind below in more detail, with reference to FIG. 4.

In a recording operation, an audio signal supplied from the input terminal 1 is applied through the AGC circuit 2 to the pre-emphasis circuit 3, to be pre-emphasized. The AGC circuit 2 is controlled by a detector 66. The pre-emphasized audio signal is divided into two signal parts, one of which is subjected to deviation adjustment by a level adjuster 32a, and then applied to an oscillator 41a through a switching circuit 28a and an adder 47a to carry out frequency modulation. Similarly, the other signal part is subjected to deviation adjustment by a level adjuster 32b, and then applied to an oscillator 41b through a switching circuit 28b and an adder 47b to carry out frequency modulation. Two AFC circuits each having a PLL configuration are made up of frequency dividers 43a and 43b, phase detectors 45a and 45b, and loop filters 49a and 49b in the same manner as in the embodiment shown in FIG. 3. In the adders 47a and 47b, respective control signals from the AFC circuits are added to the de-emphasized audio signal. The oscillators 41a and 41b and the AFC circuits make up modulators 4a and 4b for performing frequency modulation (that is, circuit parts each bounded by broken lines in FIG. 4). The center value of oscillation frequency of the modulator 4a is set to, for example, $89f_H$, and that of the modulator 4b is set, for example, $91f_H$. Frequency-modulated signals from the oscilaltors 41a and 41b are applied respectively to low pass filters 5a and 5b in which unnecessary components are removed. The outputs of the low-pass filters 5a and 5b are applied respectively to level adjusters 6a and 6b in which recording levels are adjusted. The level-adjusted audio FM signals thus obtained are added to a video FM signal supplied from the terminal 69, by means of adders 61a and 61b. The outputs of the adders 61a and 61b are recorded on the magnetic tape 8 by two rotating heads 7 and 77 so as to form alternate recording tracks on the magnetic tape 8. The pre-emphasized audio signal outputted from the switching circuit 28a and the pre-emphasized audio signal output from the switching circuit 28b are applied to a switching circuit 84 without removing their d.c. potentials. The output signal of the switching circuit 28b is made equal in d.c. potential and signal level to the output signal of the switching circuit 28a, by means of a d.c. potential adjuster 82 and a signal level adjuster 83. The set positions of the switching circuit 84 is changed by a track switching signal supplied from a terminal 86, in synchronism with the switching operatoin for switching one of the tracks of the rotating heads 7 and 77 over to the other track. The output signal of the switching circuit 84 thus oeprated passes through the de-emphasis circuit 16, and then outputtted from the terminal 17 as the monitor signal for monitoring the input audio signal.

The switching circuit 84 performs the following operation in a reproducing period. That is, the audio FM signals alternately reproduced by the rotating heads 7 and 77 are demodulated by two demodulators independently of each other, and respective outputs of the demodulators are combined with each other by the switching circuit 84 to obtain a continuous signal. In the recording operation, the modulators 4a and 4b are always supplied with the same input audio signal, and therefore only one of respective outputs of the switching circuits 28a and 28b may be taken out from the terminal 17, without changing the set positions of the switching circuit 84 in synchronism with the track switching operation.

Next, a reproducing operation will be explained. Burst or intermittent FM signals alternately reproduced from the magnetic tape by the rotating heads 7 and 77 are applied to band pass filters 65a and 65b in which the audio FM signals are extracted. The extracted audio FM signals are applied to respective first input terminals of phsae detectors 10a and 10b through limiters 9a and 9b. The second input terminals of the phase detectors 10a and 10b are applied with the outputs of the voltage-controlled oscillators (namely, VCO's) 4a and 4b, respectively. The outputs of the phase detectors 10a and 10b are applied, as control signals, to the VCO's 4a and 4b through loop filters 11a and 10b and the switching circuits 28a and 28b (each set to the reproduction side), respectively. Thus, a pair of FM demodulators each having a PLL configuration are formed. The control signals having passed through the switching circuits 28a and 28b, that is, demodulated signals are applied not only to the VCO's 4a and 4b but also the switching circuit 84. The set positions of the switching circuit 84 are changed in synchronism with the head switching operation for selecting one of the rotating heads 7 and 77, and therefore reproduced audio signals which have been alternately demodulated by the modulators and corresponds to different recording tracks, are combined with each other. Thus, a continuous audio signal is obtained.

In the VCO's 4a and 4b used in the above-mentioned modulators and demodulators, frequency dividers 43a and 43b, phase detectors 45a and 45b, loop filters 49a and 49b, and adders 47a and 47b make up control loops having a PLL configuration, on the basis of a low-frequency reference signal supplied from the terminal 44, as in the embodiment shown in FIG. 3. Thus, an AFC operation is performed in each of the VCO's 4a and 4b. Though the AFC operation in the embodiments shown in FIGS. 3 and 4 is performed by a control loop having a PLL configuration, the AFC operation may be performed by other means.

In the case where the reference signal in the embodiment shown in FIG. 4 has a frequency of 30 Hz and respective center frequencies of the VCO's 4a and 4b, as mentioned previously, are made equal to $89f_H$ and $91f_H$, respectively, a ratio of the output frequency of the frequency divider 43a to the input frequency thereof is set to 1/46725 and a ratio of the output frequency of the frequency divider 43b to the input frequency thereof is set to 1/47775.

In the case where frequency modulated signals recorded on a pair of tracks are made different in carrier frequency from each other to prevent the disturbance due to crosstalk between adjacent tracks, adjustment for making the monitor signal in the recording period equal in level to the output signal in the reproducing period can be omitted by using the same VCO in the modulator and demodulator. Thus, an increase in the number of a adjusting elements can be avoided.

We claim:

1. A modulator-demodulator for obtaining and demodulating a frequency-modulated signal and for performing a modulating operation and a demodulating operation time-sequentially, said modulating and demodulating operations using a circuit part in said modulator-demodulator in common, said modulator-demodulator comprising:

a voltage-controlled oscillator, the oscillation frequency of said oscillator varying in accordance with a signal applied to a control terminal of said oscillator;

a phase detector, one input terminal of said phase detector being applied with a frequency-modulated signal, the other input terminal of said phase detector being applied with the output signal of said voltge-controlled oscillator;

a switching circuit, one input terminal of said switching circuit being applied with a modulating signal, the other input terminal of said switching circuit being applied with the output signal of said phase detector, said switching circuit being operated in such a manner that said modulating signal applied to said one input terminal is selectively applied to said control terminal of said voltage-controlled oscillator in said modulating operation and said output signal of said phase detector applied to said other input terminal is selectively applied to said control terminal of said voltage-controlled oscillator in said demodulating operation;

means for taking out a frequency-modulated signal from an output terminal of said voltage-controlled oscillator; and means for taking out a demodulated signal from the control terminal of said voltage-controlled oscillator.

2. A modulator-demodulator for obtaining and demodulating a frequency-modulated signal according to claim 1, wherein said voltage-controlled oscillator is provided with automatic frequency control means for suppressing variations in the oscillation frequency of said voltage-controlled oscillator by utilizing a frequency lower than the frequency of said modulating signal.

3. A modulator-demodulator for obtaining and demodulating a frequency-modulated signal to be used in a recording/reproducing device for recording a signal in a recording medium in the form of a frequency-modulated signal and for obtaining a reproduced signal by demodulating a signal read out of said recording medium, said modulator-demodulator comprising:

means for inputting a signal to be recorded;

a voltage-controlled oscillator, the oscillation frequency of said oscillator varying in accordance with a signal applied to a control terminal of said oscillator;

a phase detector, one input terminal of said phase detector being applied with a frequency-modulated signal, said frequency-modulated signal being read out of said recording medium, the other input terminal of said phase detector being applied with the output signal of said voltage-controlled oscillator, said phase detector outputting an error signal corresponding to a difference in phase between said frequency-modulated signal and said output signal of said voltage-controlled oscillator applied respectively to said one and other input terminals of said phase detector;

a loop filter for removing a ripple component from the output signal of said phase detector;

a switching circuit operated in such a manner that said to-be-recorded signal inputted through said input means is applied to said control terminal of said voltage-controlled oscillator in a recording operation, and said error signal outputted from said phase detector and having passed through said loop filter is applied to said control terminal of said voltage-controlled oscillator in a reproducing operation;

means for outputting, as a signal recorded in said recording medium, a frequency-modulated signal from an output terminal of said voltage-controlled oscillator, in said recording operation; and output means for outputting, as a reproduced signal, a signal which is obtained by demodulating said frequency-modulated signal applied to said phase detector, from the control terminal of said voltage-controlled oscillator in said reproducing operation, and for outputting, as a monitor signal in said recording operation, said to-be-recorded signal which is supplied from said input means to said control terminal of said voltage-controlled oscillator, in said recording operation.

4. A modulator-demodulator for obtaining and demodulating a frequency-modulated signal according to claim 3, wherein said voltage-controlled oscillator is provided with automatic frequency control means for suppressing variations in the oscillation frequency of said voltage-controlled oscillator by utilizing a frequency lower than the frequency of said to-be-recorded signal.

5. A modulator-demodulator for obtaining and demodulating a frequency-modulated signal to be used in a recording/reproducing device for recording a signal in a recording medium in the form of a frequency-modulated signal and for obtaining a reproduced signal by demodulating a signal read out from said recording medium, said modulator-demodulator comprising:

means for inputting a signal to be recorded;

a voltage-controlled oscillator, the oscillation frequency of said oscillator varying in accordance with a signal applied to a control terminal of said oscillator;

automatic frequency control means including a reference signal source for delivering a reference signal, a frequency divider for dividing the frequency of the output signal of said voltage-controlled oscillator, and a first phase detector for comparing the phase of the output signal of the frequency divider with the phase of said reference signal to output an error signal corresponding to a difference in phase between said output signal of said frequency divider and said reference signal, said reference signal having a frequency lower than the frequency of said to-be-recorded signal applied through said input means, said error signal being applied to said control terminal of said voltage-controlled oscillator;

a second phase detector, one inut terminal of said second phase detector being applied with a frequency-modulated signal, said frequency-modulated signal being read out of said recording medium, the other input terminal of said second phase detector being applied with the output signal of said voltage-controlled oscillator, said second phase detector outputting an error signal corresponding to a difference in phase between said frequency-modulatpd signal and said output signal of said voltage-controlled oscillator applied respectively to said one and other input terminals of said second phase detector;

a loop filter for removing a ripple component from the output signal of said second phase detector;

a switching circuit operated in such a manner that said to-be-recorded signal inputted through said input means is applied to said control terminal of said voltage-controlled oscillator in a recording operation, and said error signal outputted from said second phase detector and having passed through said loop filter is applied to said control terminal of said voltage-controlled oscillator in a reproducing operation;

means for outputting, as a signal recorded in said recording medium, a frequency-modulated signal from an output terminal of said voltage-controlled oscillator, in said recording operation; and output means for outputting, as a reproduced signal, a signal which is obtained by demodulating said frequency-modulated signal applied to said second phase detector, from the control terminal of said voltage-controlled oscillator in said reproducing operation, and for outputting, as a monitor signal in said recording operation, said to-be-recorded signal which is supplied from said input means to said control terminal of said voltage-controlled oscillator, in said recording operation.

6. A modulator-demodulator for obtaining and demodulating a frequency-modulated signal according to claim 5, wherein means for operating said second phase detector only for a reproducing period is added to said second phase detector.

7. A modulator-demodulator for obtaining and demodulating an audio frequency-modulated signal to be used in a magnetic recording/reproducing device in which a signal obtained by frequency-modulating a carrier with a video signal and a signal obtained by frequency-modulating another carrier different in frequency band from said carrier with an audio signal are mixed with each other to be recorded in a magnetic recording medium, said modulator-demodulator comprising:

a voltage-controlled oscillator, the oscillation frequency of said oscillator varying in accordance with a signal applied to a control signal input terminal of said oscillator;

a phase detector, one input terminal of said phase detector being applied with an audio frequency-modulated signal, said audio frequency-modulated signal being read out of said magnetic recording medium, the other input terminal of said phase detector being applied with the output signal of said voltage-controlled oscillator, said phase detector outputting an error signal corresponding to a difference in phase between said audio frequency-modulated signal and the output signal of said voltage-controlled oscillator applied respectively to said one and other input terminals of said phase detector;

a switching circuit for performing such a switching operation that said voltage-controlled oscillator is operated as a modulator for carrying out frequency modulation, in a recording operation, by supplying a to-be-recorded audio signal to said control signal input terminal of said voltage-controlled oscillator, and said voltage-controlled oscillator and said phase detector are operated as a demodulator having a phase locked loop configuration for demodulating a frequency-modulated signal, in a reproducing operation, by supplying said error signal outputted from said phase detector to said control signal input terminal of said voltage-controlled oscillator;

means for outputting, as an audio frequency-modulated signal recorded in said magnetic recording medium, the output signal of said voltage-controlled oscillator in said recording operation; and means for outputting a demodulated audio signal from between an output terminal of said switching circuit and said control signal input terminal of said voltage-controlled oscillator in said reproducing operation.

8. A modulator-demodulator according to claim 7, wherein said voltage-controlled oscillator is provided with an automatic frequency control loop which includes another phase detector for detecting a difference in phase between a signal obtained by frequency-dividing the output signal of said voltage-controlled oscillator and a reference signal having a frequency lower than the frequency of said to-be-recorded audio signal to output an error signal, and means for supplying the output signal of said another phase detector to said control signal input terminal of said voltage-controlled oscillator.

* * * * *